US009337854B1

(12) United States Patent
Chen

(10) Patent No.: US 9,337,854 B1
(45) Date of Patent: May 10, 2016

(54) METHODS AND SYSTEMS FOR ADDRESSING COMPONENT MISMATCH IN DIGITAL-TO-ANALOG CONVERTERS

(71) Applicant: ANALOG DEVICES GLOBAL, Hamilton (BM)

(72) Inventor: Dong Chen, Beijing (CN)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 14/828,130

(22) Filed: Aug. 17, 2015

(51) Int. Cl.
H03M 1/66 (2006.01)
H03M 1/06 (2006.01)
H03M 1/74 (2006.01)

(52) U.S. Cl.
CPC .......... H03M 1/0639 (2013.01); H03M 1/0626 (2013.01); H03M 1/74 (2013.01)

(58) Field of Classification Search
CPC .... H03M 1/0639; H03M 1/0626; H03M 1/74
USPC ........................................................ 341/144
See application file for complete search history.

(56) References Cited

U.S. PATENT DOCUMENTS

| 4,937,576 A * | 6/1990 | Yoshio | ................ | H03M 1/0641 |
| | | | | 341/126 |
| 5,818,372 A | 10/1998 | Noro | | |
| 5,963,157 A | 10/1999 | Smith | | |
| 6,404,364 B1 | 6/2002 | Fetterman et al. | | |
| 6,697,003 B1 * | 2/2004 | Chen | ..................... | H03M 1/066 |
| | | | | 341/143 |
| 7,259,716 B1 | 8/2007 | Dubbert et al. | | |
| 7,679,539 B2 * | 3/2010 | Lee | ..................... | H03M 1/0673 |
| | | | | 341/120 |

OTHER PUBLICATIONS

Jianzhong Chen et al., "A Novel Noise-Shaping DAC for Multi-Bit Sigma-Delta Modulator", IEEE Transactions on Circuits and Systems—II: Express Briefs, vol. 53, No. 5, May 2006, pp. 344-348 (5 pages).
H. Scott Fetterman et al., "CMOS Pipelined ADC Employing Dither to Improve Linearity", IEEE 1999 Custom Integrated Circuits Conference, © 1999, pp. 109-112 (4 pages).
Jared Welz et al., "Simplified Logic for First-Order and Second-Order Mismatch-Shaping Digital-to-Analog Converters", IEEE Transactions on Circuits and Systems—II: Analog and Digital Signal Processing, vol. 48, No. 11, Nov. 2001, pp. 1014-1027 (14 pages).

* cited by examiner

*Primary Examiner* — Brian Young
(74) *Attorney, Agent, or Firm* — Patent Capital Group

(57) ABSTRACT

Present disclosure describes an improved mechanism for addressing component mismatch in a DAC. The mechanism is based on carefully selecting the first DAC unit of an ordered sequence of DAC units that are switched on to convert a particular digital value to an analog value. The mechanism benefits from recognition that selecting the first DAC based on a value of a band-limited dither signal, where the band of the dither signal is selected to be sufficiently removed from the band of the signal of interest, allows shifting effects of DAC units mismatch away from the signal of interest in a manner that is easy to implement and control. Because dither signal is not added to the signal of interest, but is only used to control which DAC units are turned on, drawbacks of a traditional dithering method can be avoided while benefiting from the use of dither.

20 Claims, 12 Drawing Sheets

METHODS AND SYSTEMS FOR ADDRESSING COMPONENT MISMATCH IN DIGITAL-TO-ANALOG CONVERTERS

CROSS-REFERENCE TO PRIORITY DATA

This application is a non-provisional application and claims benefit to PCT Application Serial No. PCT/CN2015/084900 filed Jul. 23, 2015 entitled "METHODS AND SYSTEMS FOR ADDRESSING COMPONENT MISMATCH IN DIGITAL-TO-ANALOG CONVERTERS", which is incorporated herein by reference in its entirety.

TECHNICAL FIELD OF THE DISCLOSURE

The present disclosure relates generally to digital-to-analog converters and, more particularly, to methods and systems for controlling digital-to-analog converters to reduce effects of component mismatch.

BACKGROUND

Real-world analog signals such as temperature, pressure, sound, or images are routinely converted to a digital representation that can be easily processed in modern digital systems. In many systems, this digital information must be converted back to an analog form to perform some real-world function. The circuits that perform this step are digital-to-analog converters (DACs), and their outputs are used to drive a variety of devices. Loudspeakers, video displays, motors, mechanical servos, radio frequency (RF) transmitters, and temperature controls are just a few diverse examples. DACs are often incorporated into digital systems in which real-world signals are digitized by analog-to-digital converters (ADCs), processed, and then converted back to analog form by DACs. In these systems, the performance required of the DACs will be influenced by the capabilities and requirements of the other components in the system.

As with many other devices fabricated using complicated manufacturing processes, one factor affecting the performance of DACs includes variations (mismatch) in performance of individual elements of a DAC (referred to herein as a "DAC unit") due to manufacturing variations or thermal drift during operation of a device. Improvements could be made with respect to addressing this issue.

Overview

Embodiments of the present disclosure provide mechanisms to digitally correct for mismatch of a DAC. The correction may be applicable to continuous-time implementations, and may be especially attractive for high-speed applications.

One aspect of the present disclose provides a method for controlling a DAC comprising a plurality of DAC units. The method includes steps performed for each digital input value of a time-series of digital input values. The steps include selecting a DAC unit of the plurality of DAC units as (i.e. "to act as") a first DAC unit of a respective ordered subset of the plurality of DAC units to convert the digital input value to an analog signal corresponding to the digital input value, and switching on the respective ordered subset of the plurality of DAC units to generate the analog signal corresponding to the digital input value, where the first DAC unit is selected based on a band-limited (i.e. narrow band) dither signal. The number of DAC units within the respective ordered subset depends on the digital input value In one embodiment of the method, the plurality of DAC units may be arranged in an array, the first DAC unit may be selected as the DAC unit that is a number d of DAC units away from a reference DAC unit of the array, and the number d may depend on (e.g. be proportional to) a value of the band-limited dither signal at a predefined time, where the predefined time may e.g. depend on a position of the digital input value being converted within the time-series of digital input values.

In one embodiment of the method, the band-limited dither signal may be such that, for each digital input value of the time-series of the digital input values, all DAC units of the respective ordered subset are positioned within the array after the first DAC unit. In this manner, warping of the switching order of the DAC units may be avoided.

In one embodiment of the method, the plurality of DAC units may be arranged in an array and the respective ordered subset may comprise consecutive DAC units of the array.

In one embodiment of the method, the band-limited dither signal may be a signal generated by a numerically controller oscillator and a frequency band of the band-limited dither signal may be such that it does not substantially overlap with a frequency band of the time-series of the digital input values (i.e. with the frequency of the signal of interest).

In one embodiment of the method, the digital input values may be converted to the analog signal using thermometer coding.

As will be appreciated by one skilled in the art, aspects of the present disclosure may be embodied in various manners—e.g. as a method, a system, a computer program product, or a computer-readable storage medium. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Functions described in this disclosure may be implemented as an algorithm executed by one or more processing units, e.g. one or more microprocessors, of one or more computers. In various embodiments, different steps and portions of the steps of each of the methods described herein may be performed by different processing units. Furthermore, aspects of the present disclosure may take the form of a computer program product embodied in one or more computer readable medium(s), preferably non-transitory, having computer readable program code embodied, e.g., stored, thereon. In various embodiments, such a computer program may, for example, be downloaded (updated) to the existing devices and systems (e.g. to the existing DACs or DAC controllers, etc.) or be stored upon manufacturing of these devices and systems.

Other features and advantages of the disclosure are apparent from the following description, and from the claims.

DESCRIPTION OF EXAMPLE EMBODIMENTS OF THE DISCLOSURE

Basics of Digital-to-Analog Converters

A DAC is a device that produces a quantized (discrete step) analog output in response to a binary digital input code. The digital input may be e.g. input from transistor logic (TTL), emitter-coupled logic (ECL), complementary metal-oxide-semiconductor (CMOS) circuits, or low-voltage differential signaling (LVDS), while the analog output may be either a voltage or a current. To generate the output, a reference quantity (either a voltage or a current) is divided into binary and/or linear fractions. Then the digital input drives switches to the individual DAC units, which could comprise current sources, voltage sources, resistors, capacitors, etc., that combine an appropriate number of these fractions to produce the output, a process sometimes referred to as "encoding." The number and size of the fractions reflect the number of possible digital input codes, which is a function of converter resolution or the number of bits (N) in the digital input code. For example, N bits could result in $2^N$ possible codes.

Figure 1:
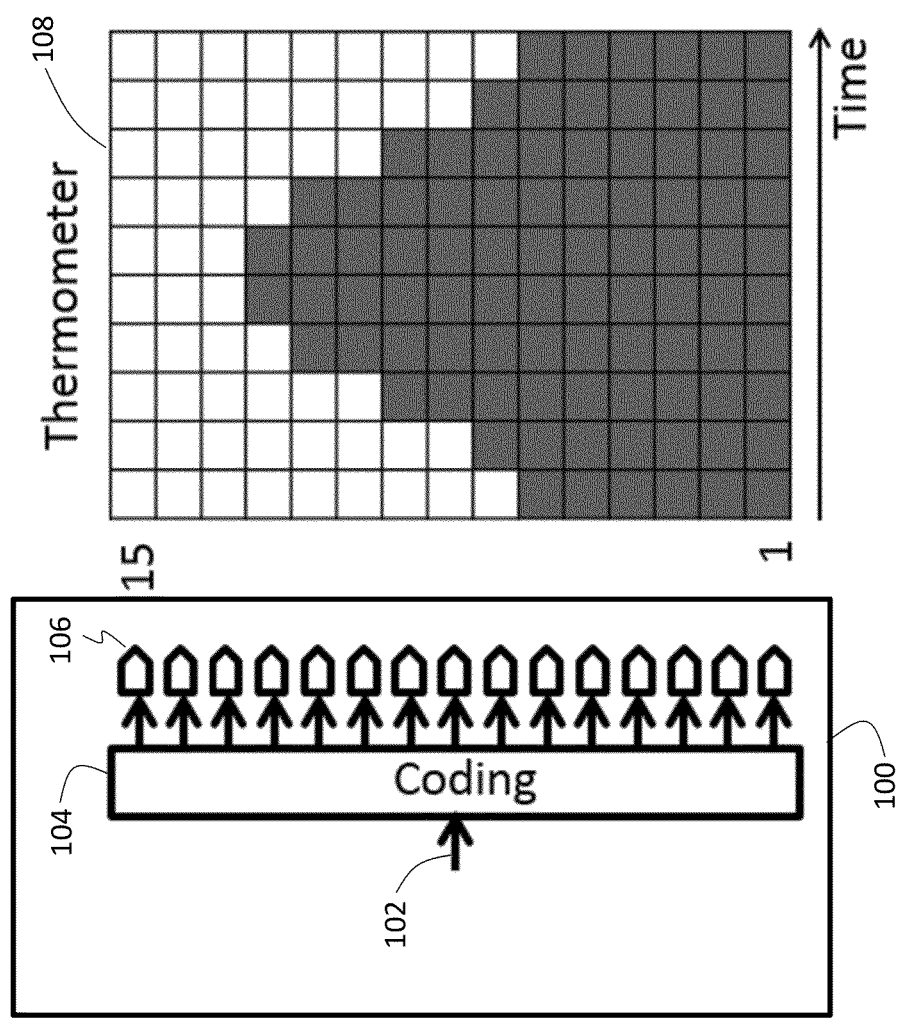
FIG. 1 illustrates switching of DAC units in an exemplary DAC, according to some embodiments of the disclosure.

FIG. 1 illustrates an exemplary DAC 100, according to some embodiments of the disclosure. In the DAC 100, a digital signal 102 is provided to a coding element (encoder) 104 which, in turn, switches the individual DAC units 106 on and off to convert digital input values of the digital signal 102 to analog values as represented by a graph 108. In the graph 108, dark squares represent DAC units 106 which are turned. Each column represents a point in time. Therefore, dark squares in the same column represent DAC units which are turned on at the same time. The number of dark squares turned on at the same time represents an analog value of the resulting analog signal at that time.

The DAC 100 with 15 units is capable of converting a 4-bit digital value (i.e., N=4) to one of 16 different analog values ($2^N$, so for N=4 the number of possible codes is $2^4$=16) by switching the appropriate DAC units 106 on. For example, to convert a digital value 0110 to an analog value, the first six DAC units are switched on (as is illustrated with dark squares in the first column of the graph 108), to convert a digital value 0111 to an analog value, the first seven DAC units are switched on (as is illustrated with dark squares in the second column of the graph 108), to convert a digital value 1001 to an analog value, the first nine DAC units are switched on (as is illustrated with dark squares in the third column of the graph 108), to convert a digital value 1011 to an analog value, the first eleven DAC units are switched on (as is illustrated with dark squares in the fourth column of the graph 108), and so on.

While in the exemplary illustration of FIG. 1 the DAC 100 includes 15 DAC units 106, teachings of the present disclosure are applicable to DACs comprising any other number of DAC units.

Segmented DACs

Figure 2:
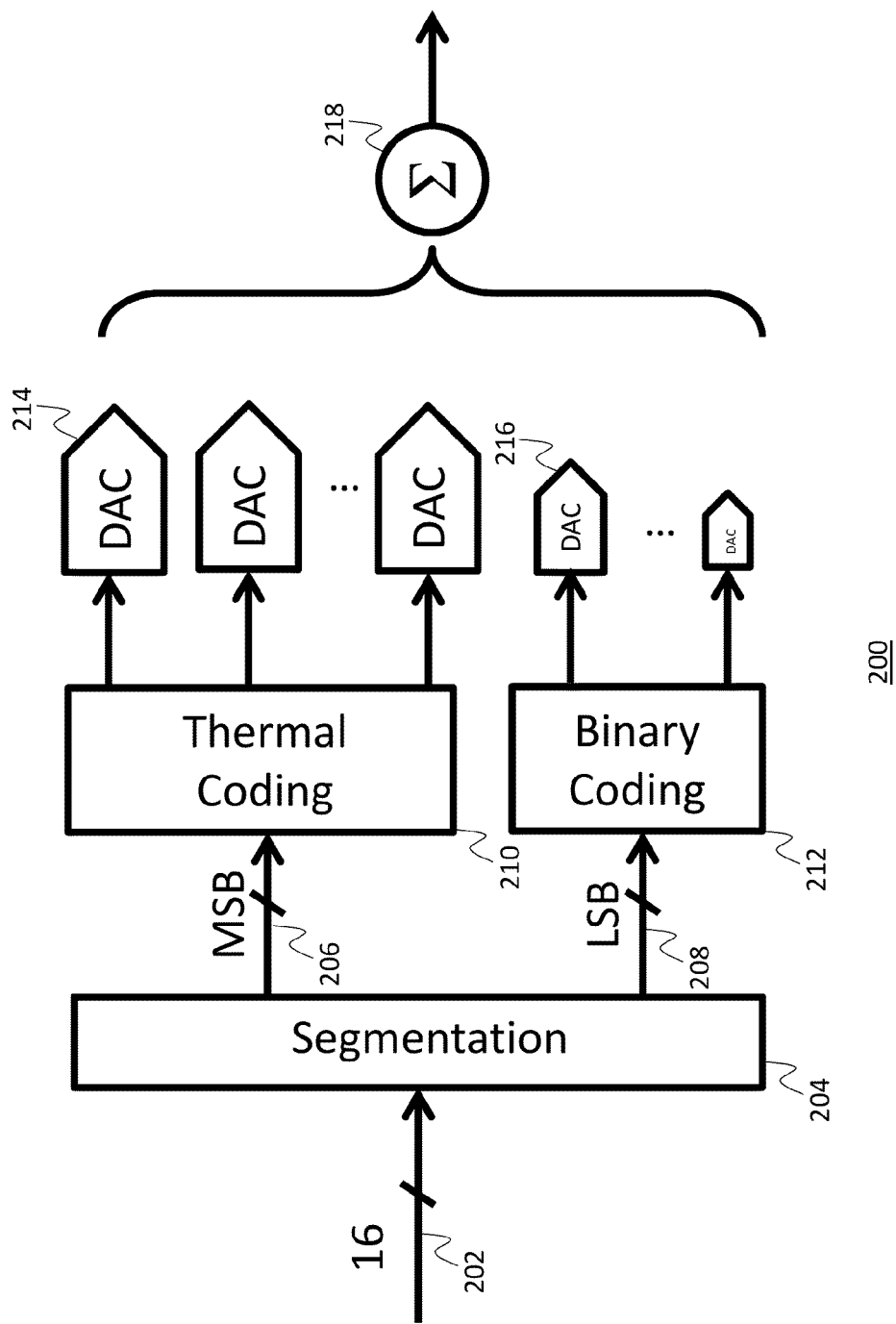
FIG. 2 illustrates an exemplary segmented DAC, according to some embodiments of the disclosure.

Segmented architectures, where the full resolution of the converter is spread across two or more sub-DACs, can be used for both current- and voltage-output DACs. FIG. 2 illustrates an exemplary segmented DAC 200, according to some embodiments of the disclosure. As shown in FIG. 2, a digital input signal 202, comprising e.g. 16-bit values, is provided to a segmentation unit 204 that separates the signal into its most significant bits (MSB) 206 and least significant bits (LSB) 208 which may then be provided to their respective coding elements 210 and 212. In the exemplary illustration of FIG. 2, the coding element for the MSB is shown as a thermal coding element, while the coding element for the LSB is shown as a binary coding element. The coding elements 210 and 212 then switch their respective DAC units 214 and 216 on and off to represent analog values. A combiner 218 is then used to combine the outputs of the DAC units 214 and 216 to generate an analog value for each digital value of the signal 202.

Segmented DACs enable finding a balance between accuracy and design complexity of a converter. One benefit of segmentation is that of reducing the number of resistors (or current sources) required to achieve a given resolution, allowing smaller die sizes. Thus, it is common for high-resolution DACs to be segmented.

Limitations on DAC Performance

Analog signals are continuous time-domain signals with infinite resolution and possibly infinite bandwidth. However, the DAC's output is a signal constructed from discrete values (quantization) generated at uniform, but finite, time intervals (sampling). In other words, the DAC output attempts to represent an analog signal with one that features finite resolution and bandwidth. Quantization and sampling impose fundamental, yet predictable, limits on DAC performance. Quantization determines the maximum dynamic range of the converter and results in quantization error or noise in the output. Sampling determines the maximum bandwidth of the DAC output signal according to Nyquist criteria. The Nyquist theory states that the signal frequency (that is, the DAC output) must be less than or equal to one-half the sampling frequency to prevent sampling images from occurring in the frequency band of the DAC output.

In addition, DAC operation is also affected by non-ideal effects beyond those dictated by quantization and sampling. One such effect is component mismatch (i.e. mismatch between the DAC units of a DAC) relating to variation in component values attributable to e.g. variations arising from the manufacturing process or thermal drift during operation of a device. Component mismatch leads to noise (mismatch errors), which may, in turn, lead to nonlinear behavior of DACs. Mismatch becomes especially pronounced for the MSB components of segmented DACs because unit values are larger there and generate more current or voltage at the output than the LSB components.

Mismatch errors may be characterized by a number of static and dynamic performance specifications or parameters that determine converter's static and dynamic performance, such as e.g. spurious-free dynamic range (SFDR), representing the strength ratio of the fundamental signal to the strongest spurious signal in the output, and noise spectral density (NSD), representing the noise power per unit of bandwidth.

These parameters are, therefore, important in choosing a suitable approach for mismatch compensation.

One approach for addressing component mismatch is to impose more stringent tolerances on manufacturing of components. However, this approach tends to decrease yield and therefore increases costs of unit components.

Other approaches include using one of dynamic element matching techniques or using a dithering method, described in greater detail below.

Dynamic Element Matching (DEM)

DEM is a class of techniques used in integrated circuits (IC) design to compensate for the component mismatch. DEM techniques typically involve some kind of a dynamic process intended to reduce the effects of component mismatches in electronic circuits by dynamically re-arranging the interconnections of mismatched components so that the time averages of the equivalent components at each of the component positions are equal or nearly equal.

Figure 3:
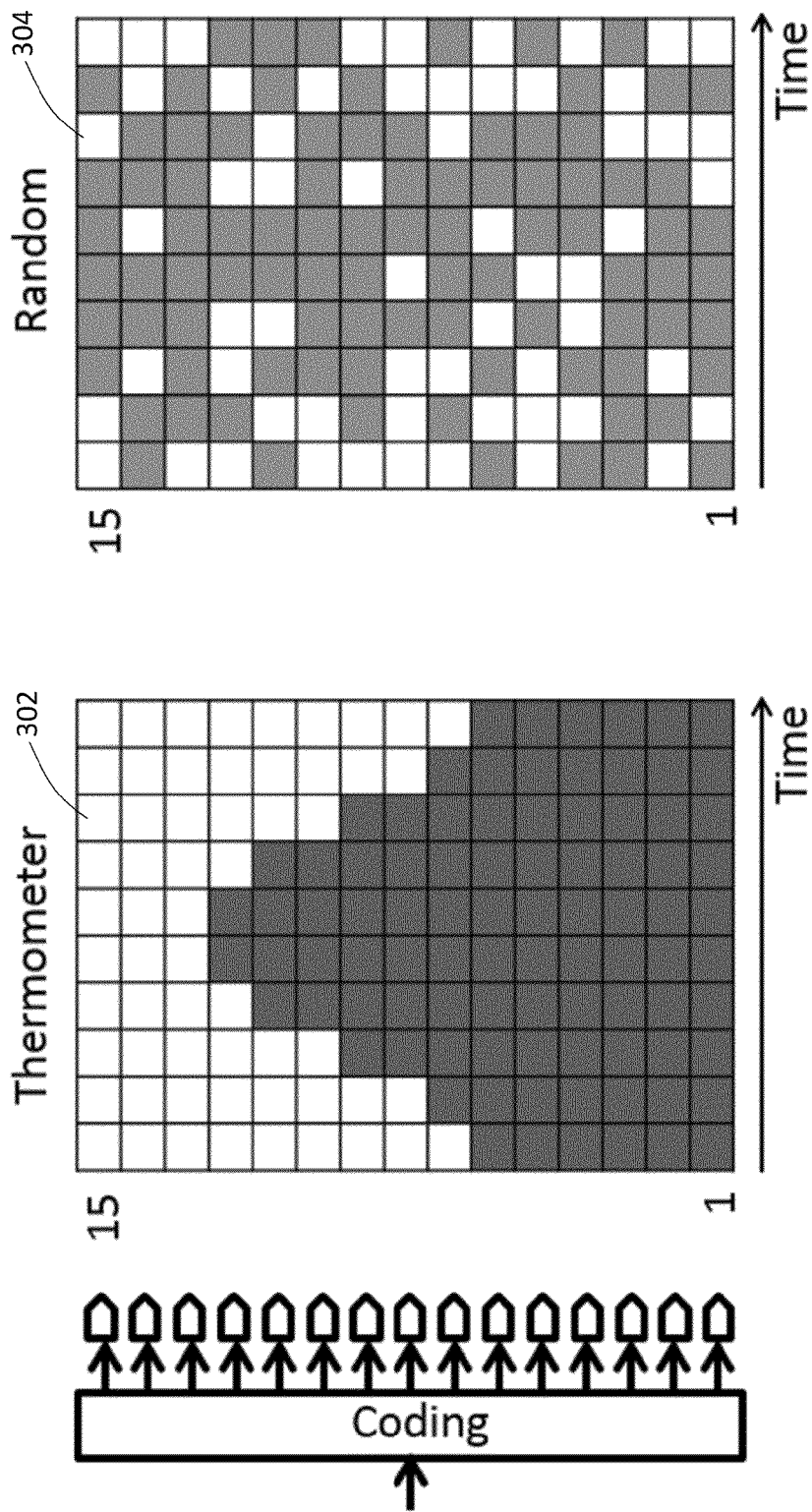
FIG. 3 illustrates a comparison of switching of DAC units with and without the use of random scrambling DEM, according to prior art.

One DEM technique, conventionally referred to as "random scrambling DEM," is based on randomizing which DAC units are turned on for converting each digital value. When random scrambling DEM is used, then, instead of switching consecutive DAC units at each point in time (i.e. to convert each digital value), the same number of non-consecutive, randomly selected DAC units are switched on. FIG. 3 illustrates a comparison of switching of DAC units with (graph 304) and without (graph 302) the use of random scrambling DEM. For both graphs, notation similar to that described with reference to the graph 108 of FIG. 1 is used, i.e. dark squares represent DAC units which are switched on and each column represents a point in time. Comparison of graphs 302 and 304 reveals that, in each respective column, the same number of DAC units is switched on, but if in the graph 302 the DAC units that are switched on are in a consecutive order, in the graph 304 the DAC units that are switched on are randomized.

While random scrambling DEM provides an easy approach to compensate for component mismatch and yields an improved SFDR, it does not allow shaping of noise attributed to the mismatch, a feature commonly referred to as "mismatch shaping." Mismatch shaping is an advantageous and desirable feature because it allows shifting of noise attributed to the mismatch to a frequency or a range of frequencies that is sufficiently distinct from the frequency band of the signal of interest, which noise could then be filtered out, producing a cleaner analog signal at the output.

Other known DEM methods include e.g. Data Weighted Averaging (DWA) and its variations, vector feedback, and tree structure. While these DEM methods may allow some order of mismatch shaping, they all suffer from various problems. For example, DWA provides a first order mismatch shaping, is relatively easy to implement and significantly improves SFDR, but has one major drawback commonly referred to as a "tone effect." In addition, DWA is not suitable for high-speed implementation, not suited for Nyquist DACs, and NSD performance is degraded. Vector feedback provides higher order mismatch shaping but is difficult to implement, where in particular a sorting circuit is very complex. Tree structure shaping also provides higher order mismatch shaping, but generating the switching sequence is complicated.

Dithering Method

Figure 4:
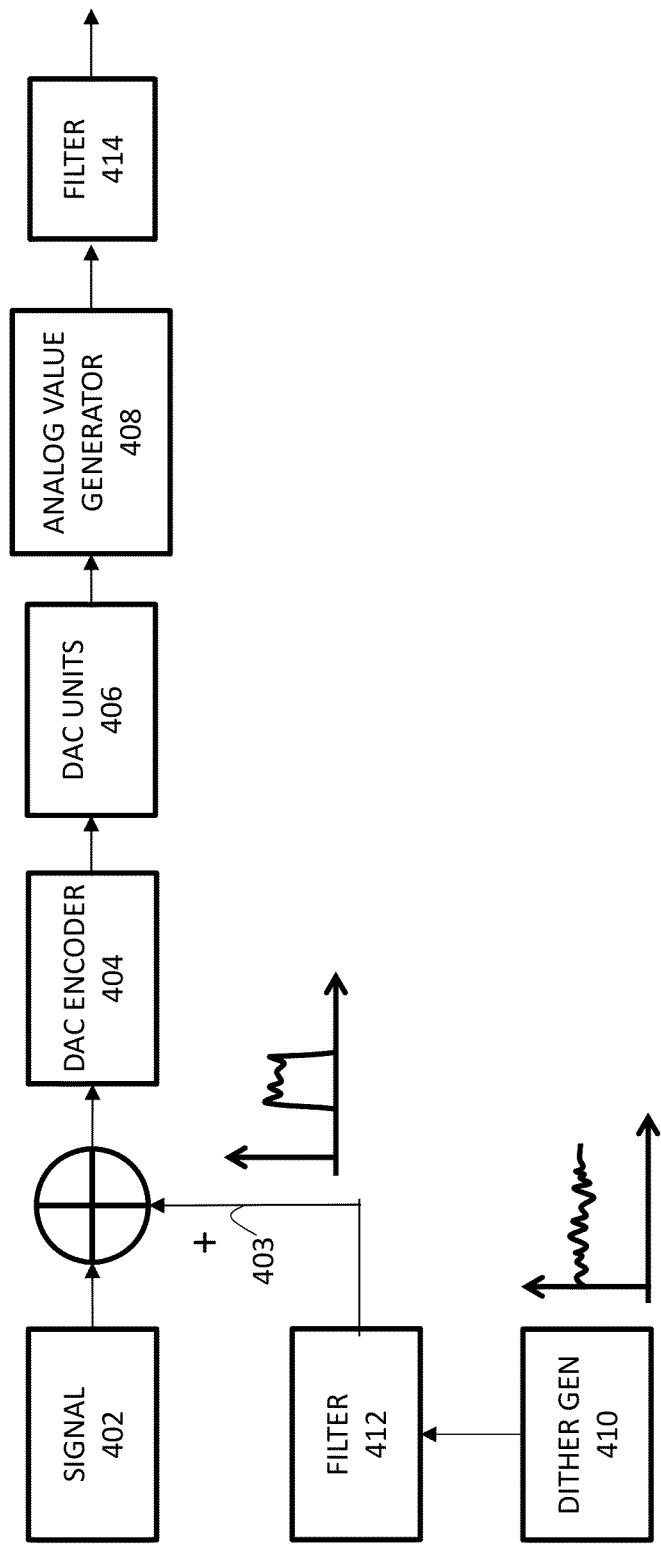
FIG. 4 provides a schematic illustration of a dithering method, according to prior art.

Another technique that could be used to address component mismatch in DACs, referred to herein as a "dithering method," is based on adding dither, i.e. an intentionally applied form of noise used to randomize quantization error, preventing large-scale patterns. FIG. 4 illustrates the dithering method, according to prior art. In FIG. 4, block 402 represents a signal of interest (i.e. the time-series of digital values to be converted to analog values), block 404 represents a DAC encoder, block 406 represents DAC units that the DAC encoder switches on and off, block 408 represents an analog value generator (i.e. an element of a DAC that converts the number of DAC units switched on at any particular time to an analog value that these DAC units are supposed to represent), block 410 represents a generator of a dither signal (i.e. a random noise generator), and block 412 represents a filter configured to limit the dither signal to a certain range of frequencies. As shown in FIG. 4, in the dithering method, band-limited dither signal (i.e. the output of the filter 412) is added to the digital signal prior to being provided to the encoder 404, as shown with an arrow 403 (denoted in FIG. 4 with a "+" sign to indicate that the dither signal is added). In other words, the digital values of the actual signal of interest are increased in accordance with the dither signal prior to being encoded. The DAC encoder 404 then encodes the values provided thereto, controls the switching of the DAC units 406, and the analog value generator 408 is configured to generate analog values depending on the number of DAC units switched on at each point in time. Thus, the dithering method differs from conventional functionality of a DAC without this mismatch compensation only in that the signal provided to the encoder is different (the digital values are larger due to the addition of the values of the dither signal), while the functionality of the encoder, the DAC units, and analog value generator is that of a conventional DAC. The band-limited signal is then filtered out in the analog domain, as shown in FIG. 4 with filter block 414.

While the dithering method allows certain mismatch shaping, improves SFDR and yields only a small degrade to NSD, a major problem with this approach is that adding the dither signal to the digital values to be converted decreases dynamic range of the DAC (i.e. given a certain number of DAC units in a DAC, the digital values of the signal of interest that could be converted to analog values without being clipped are lower because there needs to be sufficient room for adding and converting the dither signal). In addition, filtering out of the dither in analog domain is complicated and not always completely successful. Another problem is that a random signal generator that is typically used as a dither signal generator is difficult to control in frequency domain.

As the foregoing illustrates, what is needed in the art is a technique for addressing component mismatch in DACs that could improve on one or more of the problems described above.

Overview of an Improved System and Method for Addressing Component Mismatch

The present disclosure describes an improved mechanism for addressing component mismatch in DACs that alleviates some of the issues mentioned above. The improved mechanism is based on carefully selecting the first DAC unit of an ordered sequence of DAC units that are switched on to convert a particular digital value to an analog value. The mechanism is based on recognition that selecting the first DAC based on a value (e.g. on the current value) of a band-limited dither signal, where the band (i.e. the frequency range) of the dither signal is selected to be sufficiently removed, or distinct, from the band of the signal of interest, allows shifting effects of the mismatch (i.e. mismatch shaping) away from the signal of interest in a manner that is easy to implement and control. Because dither signal is not added to the signal of interest, but is only used to control which DAC units are turned on, drawbacks of the traditional dithering method can be avoided, while retaining benefits resulting from the use of band-limited dither. For example, in contrast to the traditional dithering method, the proposed improved method does not decrease dynamic input range of a DAC because the number of the DAC units that are turned on does not increase as it does with the traditional dithering method due to addition of the dither signal prior to encoding. In addition, in contrast to the traditional dithering method, the proposed improved method does not require filtering of the dither signal in the analog domain, which is, again, because the dither signal is not actually added to the signal of interest, but is only used to control which DAC unit is selected as the first DAC unit. Because, although a band-limited dither signal is used, it is neither added nor subtracted from the signal of interest, the proposed improved method may be referred to as "virtual dithering method."

Embodiments of the present disclosure are particularly, though not exclusively, suitable for high-speed DACs. Since the mismatch error can be shaped anywhere (i.e. the frequency range for the mismatch error can be user-defined), embodiments of the present disclosure are suitable for Nyquist DACs. The improved mechanism yields small degrade to NSD compared to other techniques typically used for component mismatch in DACs.

Since any deviation or mismatch has the largest contribution with MSB DAC units, embodiments of the present disclosure are particularly advantageous to such DAC units (e.g. DAC units 214 shown in FIG. 2).

Furthermore, the proposed improved method may advantageously be used alone as well as in combination with any of the known DEM techniques.

Exemplary Improved System and Method for Addressing Component Mismatch

Figure 5:
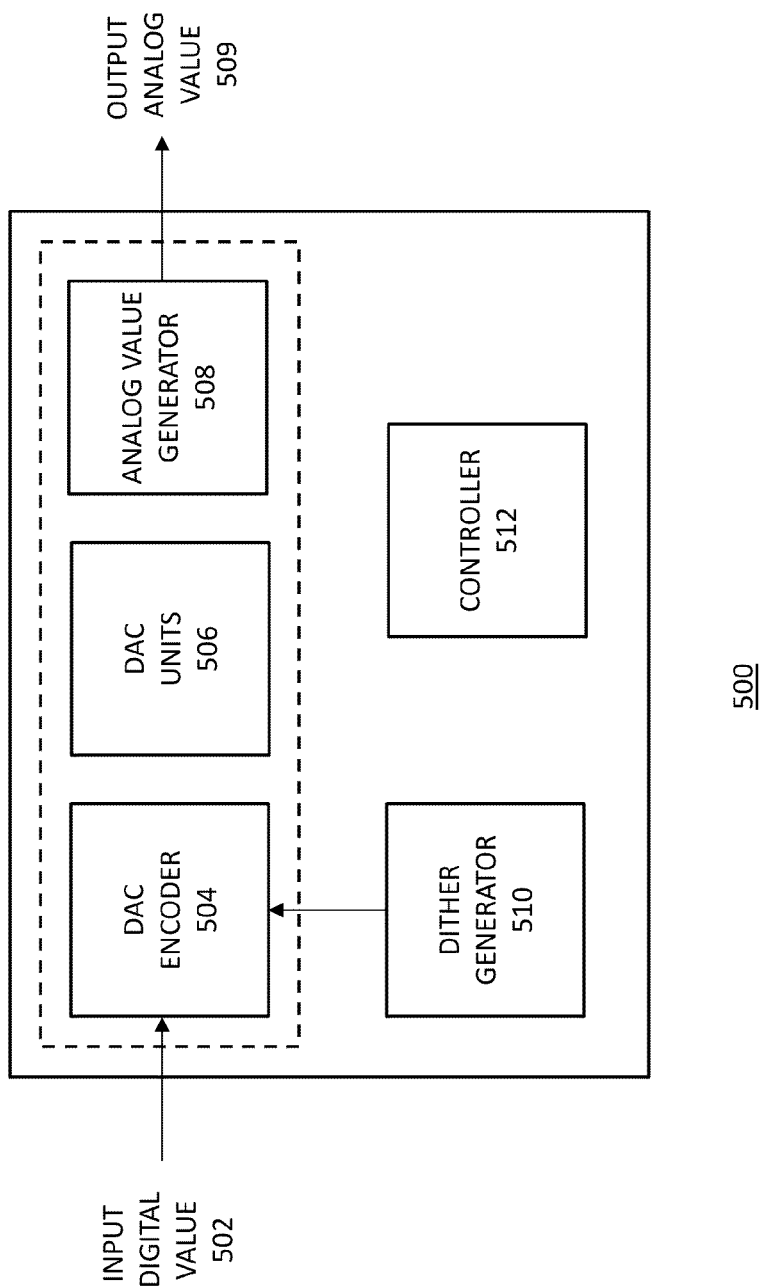
FIG. 5 illustrates a system view of an exemplary apparatus configured to implement virtual dithering method for dynamic element matching of a DAC, according to some embodiments of the disclosure.

FIG. 5 illustrates a system view of an exemplary apparatus 500 configured to implement virtual dithering method for dynamic element matching of a DAC, according to some embodiments of the disclosure. The system provides an exemplary arrangement of parts for implementing or enabling a virtual dithering method for controlling a DAC to improve or eliminate mismatch errors. An input digital value of an input signal 502 is provided to a DAC encoder 504, as shown in FIG. 5 with a horizontal arrow to the DAC encoder 504. The DAC encoder 504 controls which ones of a plurality of DAC units 506 are switched on, and an analog value generator 508 generates an output analog value 509 based on the DAC units 506 that are switched on, the output analog value 509 representing the input digital value 502.

In various embodiments, the digital input 502 may e.g. comprise signal/samples from transistor logic (TTL), emitter-coupled logic (ECL), complementary metal-oxide-semiconductor (CMOS) circuits, or low-voltage differential signaling (LVDS), while the analog output 509 may be either a voltage or a current. The DAC encoder 504 may be configured to implement any coding method, such as, but not limited to, thermometer coding, to switch certain DAC units 506 on and off. The DAC units 506 could comprise any elements, such as e.g. current sources, voltage sources, resistors, capacitors, etc., which can produce output signals combined by the analog value generator into a single analogue value representative of the digital input value.

As shown with a vertical arrow to the DAC encoder 504, the encoder 504 uses a band-limited dither signal generated by a dither generator 510 to control which ones of the plurality of DAC units 506 are switched on, as described in greater detail below. The dither generator 510 may comprise any element, apparatus, or system configured to generate band-limited dither signal. Preferably, the dither generator 510 is such that the frequency band of the band-limited dither signal can be controlled. In this manner, it is possible to generate a dither signal that is localized to a desired frequency band for any particular application (i.e. depending on the band of the signal of interest used in any particular application), ensuring that the band of the dither signal is substantially removed (i.e. distinct from) the band of the signal of interest.

A person skilled in the art would readily recognize various possibilities, depending on a particular application, for what is implied by the band of the dither signal being "sufficiently removed" from the band of the signal of interest, all of which possibilities are within the scope of the present disclosure. For example, if the signal of interest is at a low frequency band, then band of the dither signal (and, hence, the noise resulting from the component mismatch) could be localized in a high frequency band, e.g. close to Fs/2, where Fs is the sampling frequency.

In an embodiment, the dither generator 510 may be implemented as a numerically-controlled oscillator (NCO) working in sweep frequency mode, as described in greater detail in a section below.

In some embodiments, the band of the dither signal may be specified, e.g. by a user of the apparatus 500, depending on the particular implementation. In other embodiments, a controller 512, shown in FIG. 5, may be configured to determine appropriate band of the dither signal. Thus, the controller 512 may be used to control the functionality of the dither generator 510. For example, the controller 512 could be configured to determine or otherwise obtain information indicative of the band of the signal of interest, and select the band of the band-limited dither signal accordingly (i.e. to be sufficiently removed from the band of the signal of interest). In such embodiments, the controller 512 may be configured to use e.g. predefined design criteria provided to the controller 512 (e.g. pre-programmed).

Additionally or alternatively to controlling the functionality of the dither generator 510, the controller 512 may be configured to implement or control that the DAC encoder 504 uses the virtual dithering method to select the first DAC unit for converting an input digital value into an output analog value. Since the controller 512 controls functionality of the DAC encoder 504, description of a DAC encoder performing certain steps of a virtual dithering method described herein may be considered equivalent to the controller 512 performing the steps, and vice versa.

Figure 12:
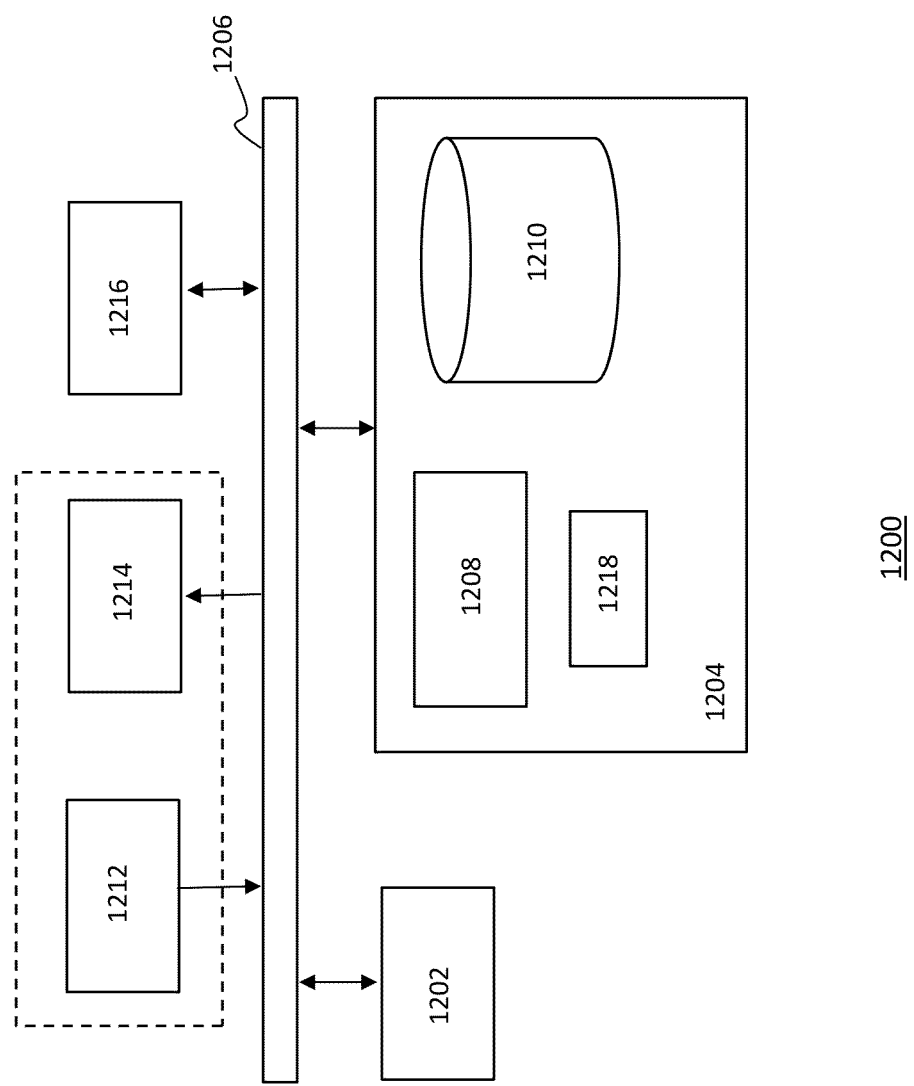
FIG. 12 depicts a block diagram illustrating an exemplary data processing system, according to one embodiment of the present disclosure.

In some embodiments, in order to control the functionality of the DAC encoder and, optionally, of the dither generator 510, the controller 512 may include a memory and a processor (not shown in FIG. 5). In various embodiments, the controller 512 can include several special application specific parts or modules, electronic circuits, and/or programmable logic gates specially arranged for controlling the functionality of the DAC encoder 504 as described herein. The controller 512 may comprise a digital signal processor provided with application specific components to implement the virtual dithering method and/or configured to execute special instructions (stored on non-transitory computer readable-medium) for carrying out the virtual dithering method as described herein. FIG. 12 illustrates an exemplary data processing system that could be implemented to carry out functionality of the controller 512.

In FIG. 5, the DAC encoder 504, the DAC units 506, and the analog value generator 508 are surrounded by a dashed box to illustrate that these three elements typically form a DAC. However, in other embodiments, the apparatus 500 may comprise only one or only some of the blocks shown in FIG. 5, with functional elements represented by other blocks being implemented separately from the apparatus 500. For example, the functionality of the dither generator 510 and/or the controller 512 may be implemented apart from the functionality of a DAC. In particular, the dither generator 510 and the controller 512 may be used to retrofit existing DACs, i.e. to enable existing DACs to carry out virtual dithering method as described herein.

Figure 6:
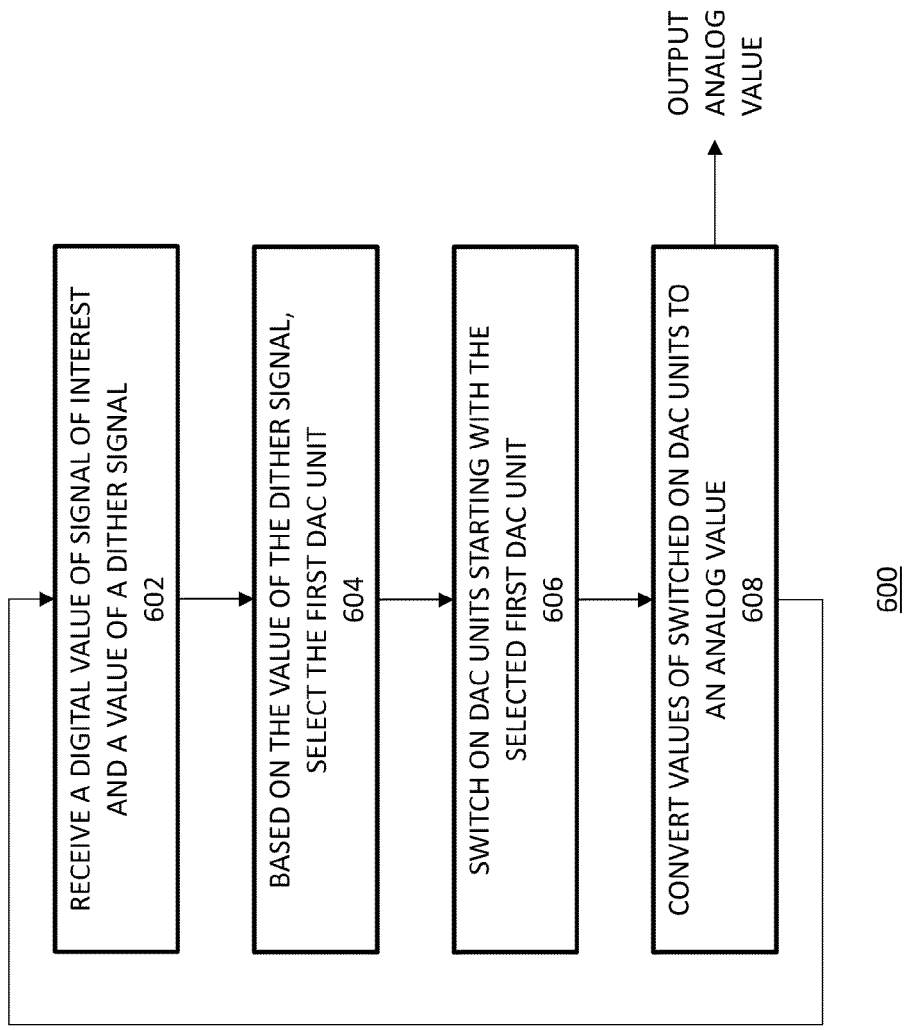
FIG. 6 illustrates an exemplary flow diagram of a virtual dithering method for dynamic element matching of a DAC, according to some embodiments of the disclosure.

FIG. 6 illustrates an exemplary flow diagram 600 of a virtual dithering method for dynamic element matching of a DAC, according to some embodiments of the disclosure, e.g. implemented by the controller 512 controlling operation of the DAC encoder 504 shown in FIG. 5. Although steps of the method 600 are described with reference to the elements shown in FIG. 5, any other systems or apparatuses configured to carry out steps of the method 600, in any order, are within the scope of the present disclosure.

At a high level, the method 600 may begin with a step 602, where the DAC encoder 504 receives a digital value of the digital signal of interest 502. In addition, the DAC encoder 504 receives a value of the band-limited dither signal generated by the dither generator 510. For example, the DAC encoder 504 may be configured to get time-series of digital values of the digital signal and corresponding time-series of the values of the dither signal generated by the dither generator 510 (e.g. each time a new digital value 502 is received at the DAC encoder, a current value of the dither signal generated by the dither generator 510 is also obtained).

In step 604, based on the value of the dither signal corresponding to the received digital value, the DAC encoder 504 selects one of the DAC units 506 to act as the first DAC unit of a subset of the plurality of DAC units 506 that the DAC encoder 504 will switch on in order to convert the received digital value to an analog value. The subset of the DAC units that will be switched on is ordered in a sense that it is possible to define one of the DAC units as "the first" DAC unit. In step 606, the DAC encoder 504 switches on the ordered subset of the plurality of DAC units 506 starting with the first DAC unit selected in step 604.

Figure 7:
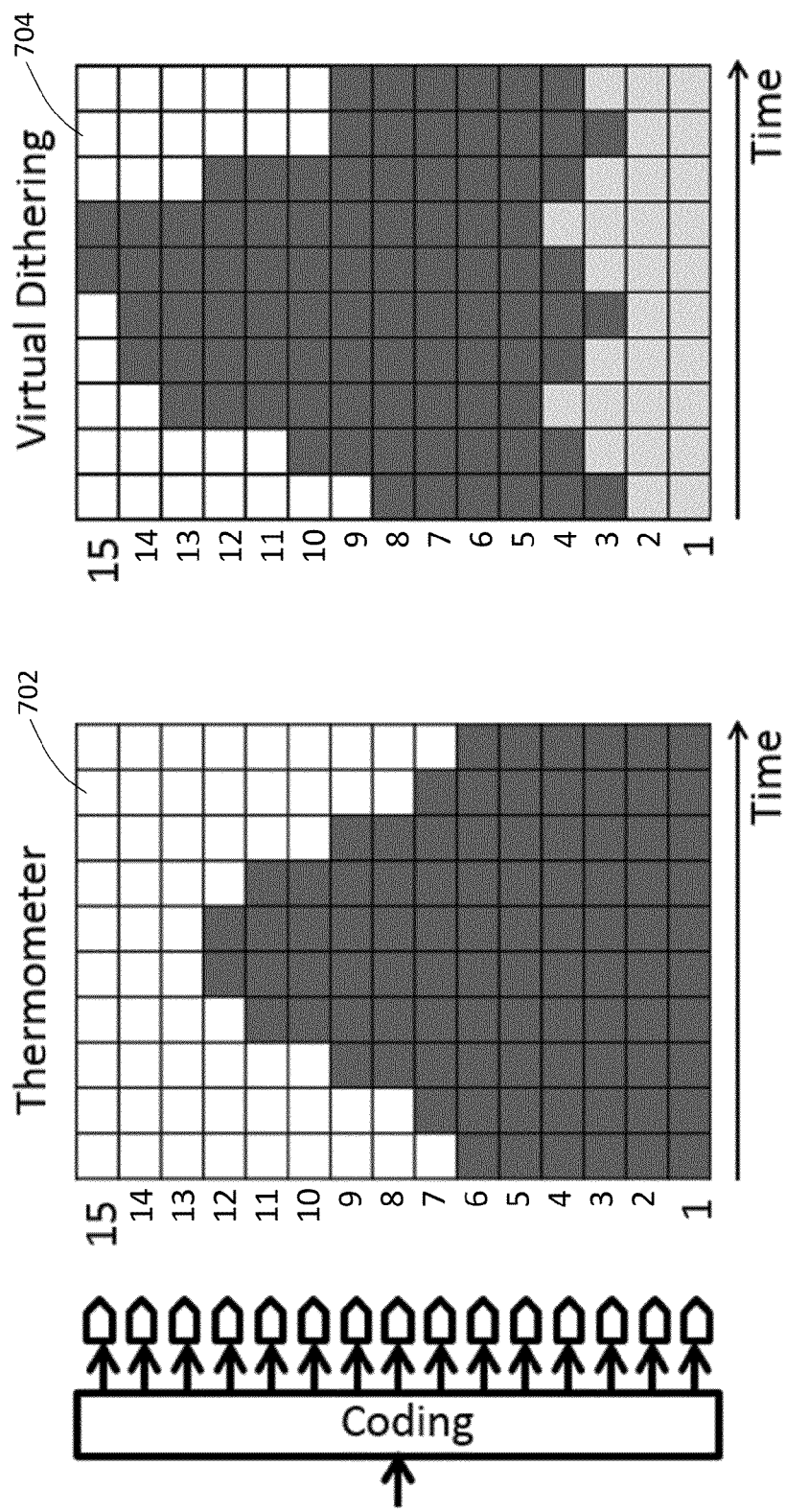
FIG. 7 illustrates a comparison of switching of DAC units with and without the use of virtual dithering, according to some embodiments of the disclosure.

Selection of a DAC unit to be the first DAC unit of an ordered subset is shown in FIG. 7 illustrating a comparison of switching of DAC units with (graph 704) and without (graph 702) the use of virtual dithering, according to some embodiments of the disclosure.

For both graphs shown in FIG. 7, notation similar to that described with reference to the graph 108 of FIG. 1 is used, i.e. dark squares represent DAC units which are switched on and each column represents a point in time (i.e. represents conversion of a particular digital value of the digital input signal). Comparison of graphs 702 and 704 reveals that, in each respective column, the same number of DAC units is switched on, but if in the graph 702 the DAC units that are switched on include consecutive DAC units starting from the DAC unit numbered as a DAC unit 1 (of the fifteen DAC units illustrated in FIG. 7), in the graph 704 the DAC units that are switched on start from a different DAC unit at different points in time (i.e. in different columns representing conversion of different digital values).

For example, to convert a digital value 0110 (an exemplary first value of the digital input signal as illustrated in the graphs of FIG. 7) to an analog value, instead of switching on the first six DAC units, i.e. DAC units 1-6 (as illustrated with dark squares in the first column of the graph 702), according to the proposed virtual dithering method, the DAC encoder selects DAC unit 3 to be the first DAC unit of a sequence of six DAC units and switches on DAC units 3-8 (as illustrated with dark squares in the first column of the graph 704). To convert a digital value 0111 (an exemplary second value of the digital input signal as illustrated in the graphs of FIG. 7) to an analog value, instead of switching on the first seven DAC units, i.e. DAC units 1-7 (as illustrated with dark squares in the second column of the graph 702), according to the proposed virtual dithering method, the DAC encoder selects DAC unit 4 to be the first DAC unit of a sequence of seven DAC units and switches on DAC units 4-10 (as illustrated with dark squares in the second column of the graph 704). To convert a digital value 1001 (an exemplary third value of the digital input signal as illustrated in the graphs of FIG. 7) to an analog value, instead of switching on the first nine DAC units, i.e. DAC units 1-9 (as illustrated with dark squares in the third column of the graph 702), according to the proposed virtual dithering method, the DAC encoder selects DAC unit 5 to be the first DAC unit of a sequence of nine DAC units and switches on DAC units 5-13 (as illustrated with dark squares in the third column of the graph 704). To convert a digital value 1011 (an exemplary fourth value of the digital input signal as illustrated in the graphs of FIG. 7) to an analog value, instead of switching on the first eleven DAC units, i.e. DAC units 1-11 (as illustrated with dark squares in the fourth column of the graph 702), according to the proposed virtual dithering method, the DAC encoder selects DAC unit 4 to be the first DAC unit of a sequence of eleven DAC units and switches on DAC units 4-14 (as illustrated with dark squares in the fourth column of the graph 704), and so on.

Thus, as seen in FIG. 7, with virtual dithering method, to convert each digital value to an analog value, the same number of DAC units are switched on as is done conventionally (i.e., in the absence of the virtual dithering method), but the first DAC unit for each digital value is selected based on the current value (possibly with some time offset with respect to the digital value) of the dither signal generated by the dither generator 510. In FIG. 7, the dither signal may be seen as the DAC units below the DAC units that are switched on at each point in time (i.e. in each column). For example, when for the digital value 0110 is converted (i.e., the first column in the graph 704), the dither signal is such that the DAC units 1 and 2 are "skipped" and DAC unit 3 is selected to be the first DAC unit, when the digital value 0111 is converted (i.e., the second column in the graph 704), the dither signal is such that the DAC units 1-3 are "skipped" and DAC unit 4 is selected to be the first DAC unit, and so on.

In general, when the DAC units 506 are arranged in any kind of an ordered array (e.g. FIG. 7 illustrating a linear, i.e. one dimensional array), the first DAC unit for conversion of a particular digital value may be selected as the DAC unit that is a certain number K of DAC units away from a reference DAC unit of the array, where the value of the number K depends on the value of the band-limited dither signal at a certain time (e.g. on the value of the dither signal at the time the digital value being converted is provided to the DAC encoder). For example, for the example shown in the graph 704 in FIG. 7, the reference DAC unit could be considered to be the DAC unit 1. As a result, the number K for the first digital value (0110 in the example of FIG. 7) is 1 (i.e. the first DAC unit 3 is one DAC unit away from the reference DAC unit 1), the number K for the second digital value (0111 in the example of FIG. 7) is 2 (i.e. the first DAC unit 4 is two DAC units away from the reference DAC unit 1), and so on.

It should be noted that, while FIG. 7 illustrates virtual dithering method where the DAC units switched on at each point in time comprise consecutive DAC units, in general, embodiments of the virtual dithering method are not limited to consecutive subsets of DAC units switched on to represent a digital value. Any order of a subset of an array of DAC units may be used, as long as it is sensible to define "the first" DAC unit in such a subset. For example, instead of switching on DAC units 3-8 to represent a digital value 0110, an ordered subset of DAC units may include DAC units 3, 5, 7, 9, 11, and 13. A person skilled in the art will recognize modifications, advantages, and limitations applicable to using various types of ordered subsets, all of which are within the scope of the present disclosure.

Furthermore, the virtual dithering method described herein may be combined with various DEM techniques as known in the art. For example, starting from the first DAC unit selected as described above, other DAC units that are switched on could be randomized (i.e. combination with random scrambling approach).

Returning back to the method 600 shown in FIG. 6, in step 608, the analog value generator 508 generates an analog value for the digital value being processed, by combining the signals produced by the DAC units that have been switched on in step 606, as is known in the art. The method can then continue back to step 602 to process other data samples in the stream (i.e. time series) of data samples of the digital input signal.

Figure 8:
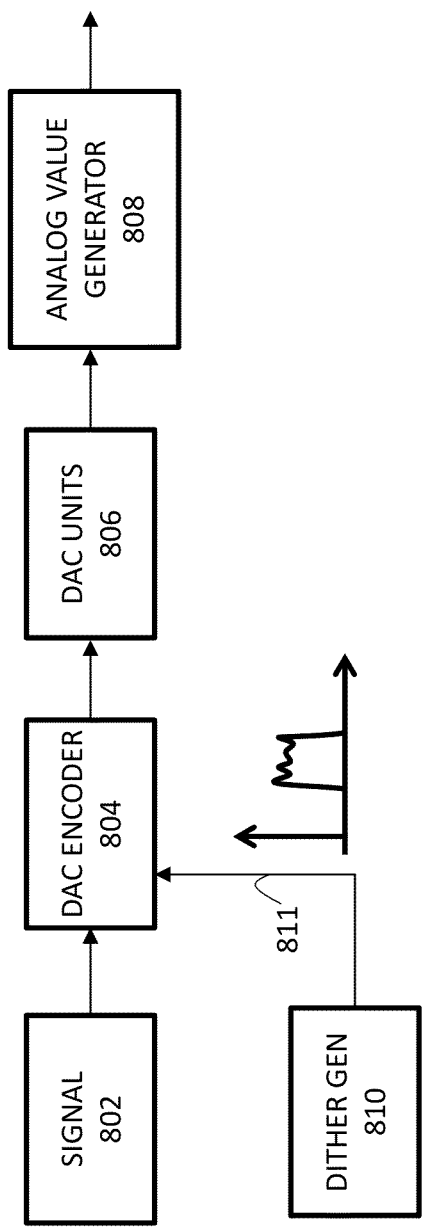
FIG. 8 provides a schematic illustration of a virtual dithering method, according to some embodiments of the disclosure.

FIG. 8 provides a schematic illustration of a virtual dithering method, according to some embodiments of the disclosure.

In FIG. 8, block 802 represents a signal of interest (i.e. the time-series of digital values to be converted to analog values), block 804 represents a DAC encoder, block 806 represents DAC units that the DAC encoder switches on and off, block 808 represents an analog value generator (i.e. an element of a DAC that converts the number of DAC units switched on at any particular time to an analog value that these DAC units are supposed to represent), and block 810 represents a generator of a dither signal (e.g. an NCO-based dither generator). Elements 802, 804, 806, and 810 are analogous to elements 502, 504, 506, and 510, respectively, and, therefore, their description and operation in accordance with method 6 of FIG. 6 is not repeated here.

Figure 9:
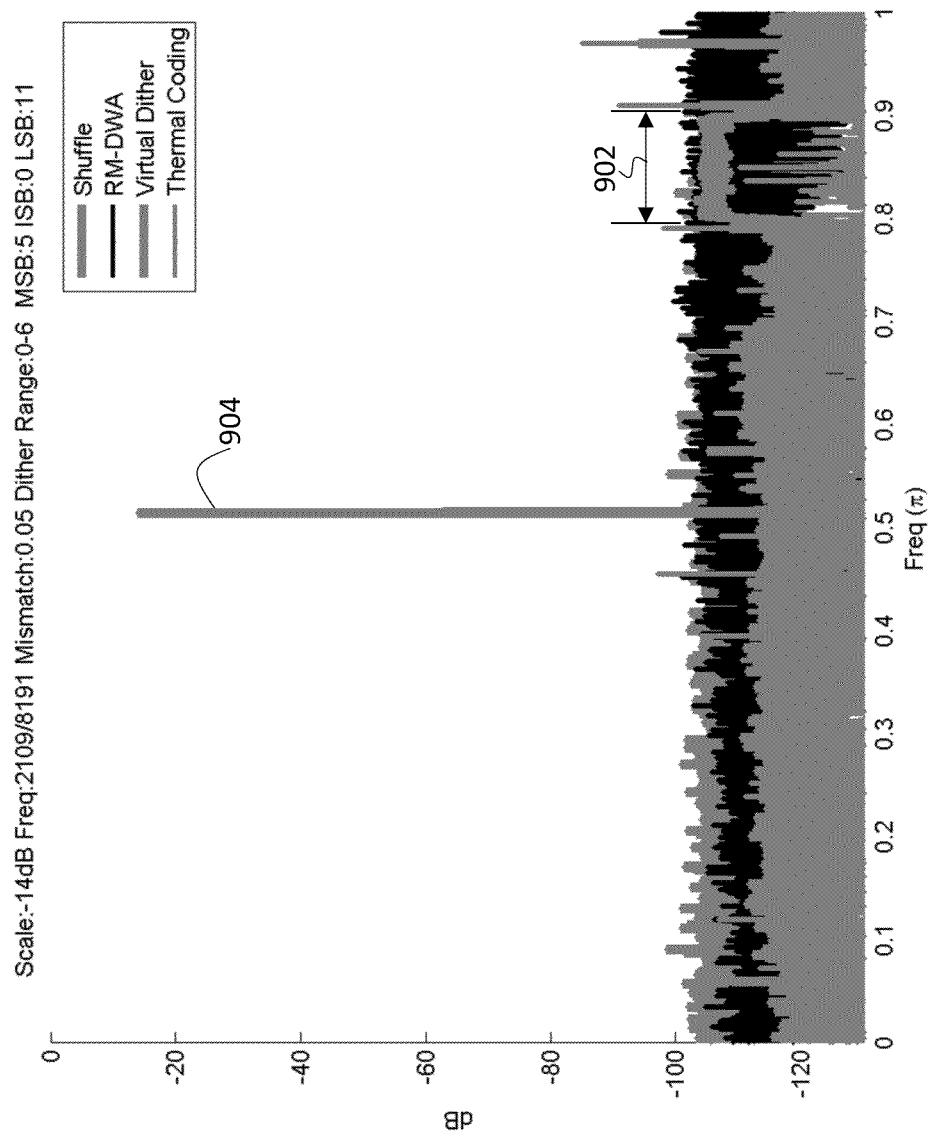
FIG. 9 illustrates simulation results for shaping of mismatch error by applying virtual dithering, according to some embodiments of the disclosure.

In contrast to the dithering method illustrated in FIG. 4, the virtual dithering described herein does not add and does not subtract the dither signal to the signal of interest. Instead, the band-limited dither signal generated by the dither generator 810/510 is used to control which DAC unit is considered to be the first DAC unit by the DAC encoder, as shown in FIG. 8 with an arrow 811. In other words, the band-limited dither signal is used to control the starting pointer of the DAC encoder. Controlling the first DAC unit in dependence of a band-limited dither signal allows shaping the mismatch error into the frequency band of the dither signal. This is illustrated in FIG. 9, showing simulation results for shaping of mismatch error by applying virtual dithering, according to some embodiments of the disclosure. The noise due to the mismatch error may then be filtered out using an appropriate filter.

In FIG. 9, mismatch error is shifted to a frequency band 902, which is sufficiently removed from the signal of interest 904, and, therefore, can easily be filtered out. Therefore, by selecting the frequency band of the band-limited dither signal depending on the frequency band of the signal of interest 502, the mismatch error can always be shifted as to not overlap with the band of the signal of interest. In this manner, noise due to component mismatch can be shaped to a predefined (e.g. user defined) frequency location.

Dealing with "Warping" Effect

Figure 10:
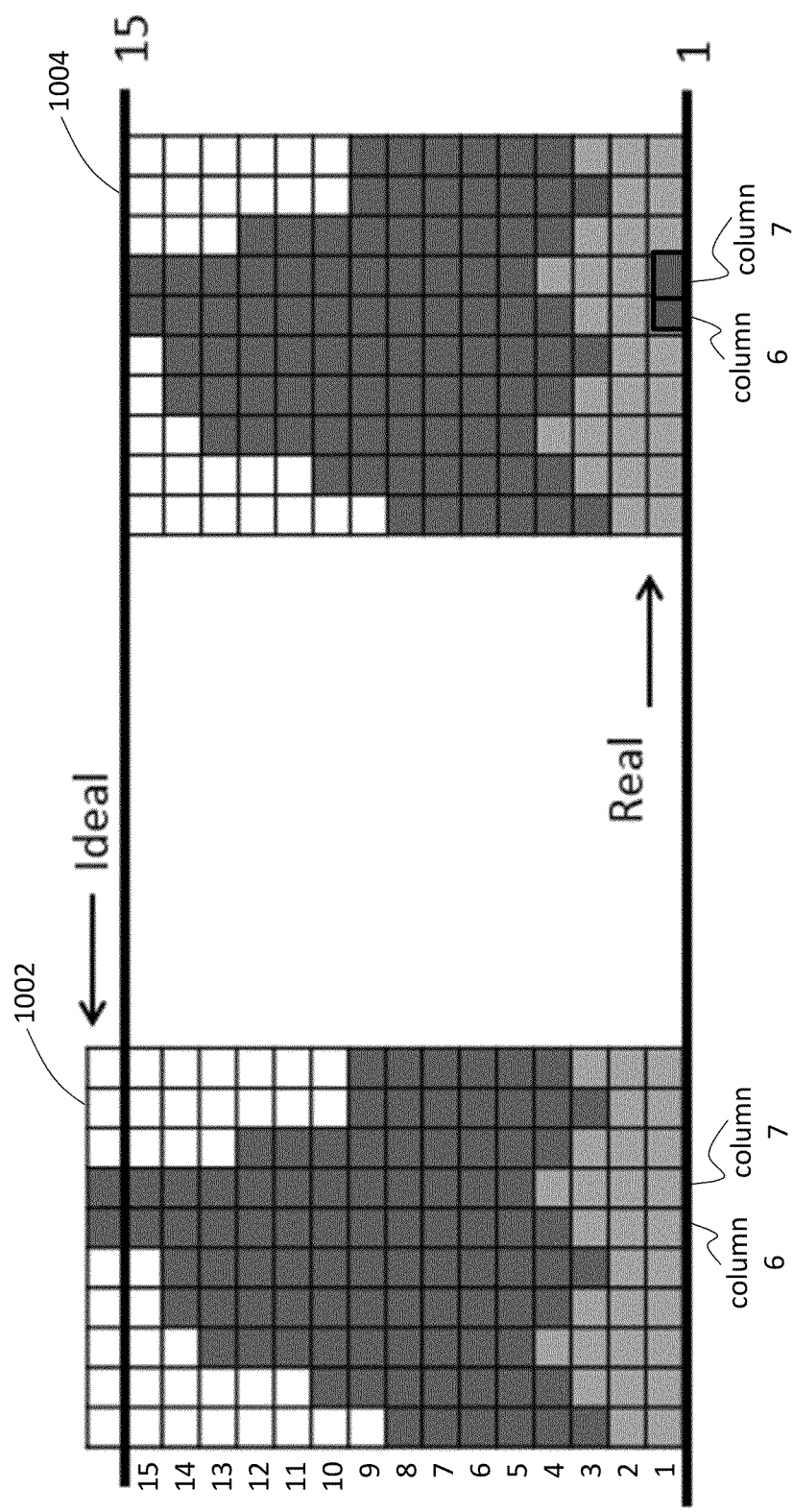
FIG. 10 illustrates "warping effect" in virtual dithering, according to some embodiments of the disclosure.

Simulation results have illustrated that, when the signal amplitude is close to full scale, virtual dithering as described herein may not be as effective. One reason for that could be that, when dither value and digital value to be converted are higher than the total range allowed by a certain number of DAC units, the "warp around" will degrade mismatch shaping. This situation is illustrated in FIG. 10. As shown with a graph 1002, the dither signal and the digital value to be converted at a particular point in time could be such that it would require more DAC units that are available to switch on the required ordered sequence of DAC units. In FIG. 10, example with 15 DAC units is considered again and the graph 1002 illustrates that to convert a digital value of 1101 when the dither value is such that the first DAC unit is DAC unit 4, then DAC units 4-16 (i.e. thirteen DAC units) need to be switched on (shown with column 6 in the graph 1002) and to convert a digital value of 1100 when the dither value is such that the first DAC unit is DAC unit 5, then DAC units 5-16 (i.e. twelve DAC units) need to be switched on (shown with column 7 in the graph 1002). However, there are only 15 DAC units available. As a result, the last DAC unit for columns 6 and 7 that need to be switched on will be DAC unit 1—the "warp around" effect, as shown with DAC units 1 being shown as switched on for the same example shown in graph 1004.

In order to avoid such warp around, band-limited dither signal could be selected to be such in magnitude that, for all digital input value of the time-series of the digital input values, all DAC units of the ordered subset are positioned within the array after the first DAC unit. Note that for the example shown in graph 1004 of FIG. 10 this is not the case as some of the DAC units of the ordered subsets for the digital values of columns 6 and 7 are position within the array of 15 DAC units before the first DAC unit (i.e. before the DAC unit 4 and 5 for columns 6 and 7, respectively). To avoid such a problem, the dithering signal illustrated in FIG. 10 could be reduced in magnitude by what corresponds to one DAC unit (i.e., for each column shown in the graph 1004, the first DAC unit could be moved down by one, not shown in the FIGUREs).

Numerically-Controlled Oscillator (NCO) Working in Sweep Frequency Mode

Figure 11:
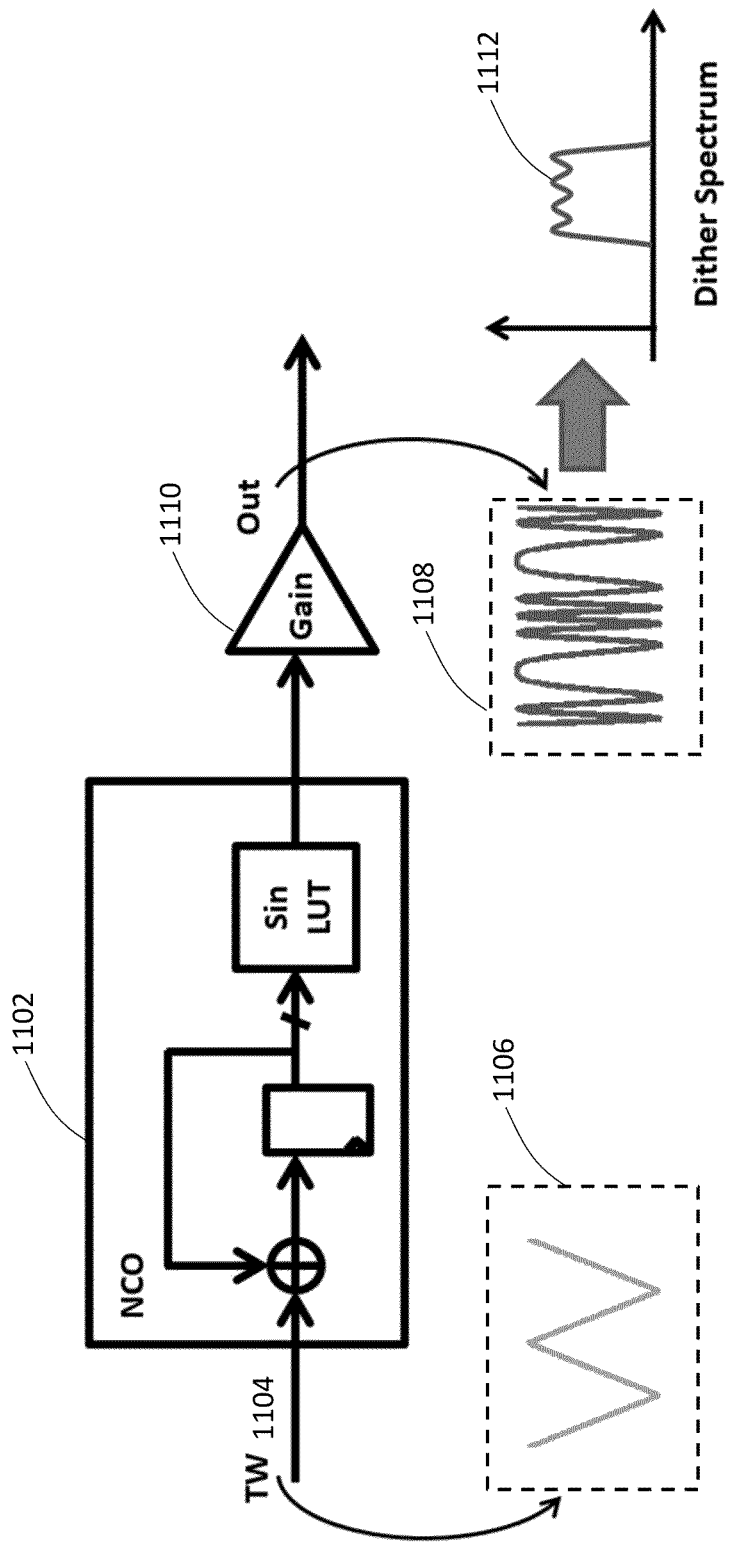
FIG. 11 illustrates generation of a band-limited dither signal using numerically controlled oscillator, according to some embodiments of the disclosure.

As previously described herein, proposed virtual dithering method is based on using narrow-band (i.e. band-limited) dither signal, as opposed to e.g. using wideband white noise dither. In one embodiment, a numerically controlled oscillator (NCO) operating in sweet frequency mode may be used to generate such a signal, an example of which is illustrated in FIG. 11 as an NCO 1102.

The NCO 1102 will output a tone which frequency is controlled by a tuning word (TW 1104 shown in FIG. 11) at its input. If the tuning word is changing with time, the frequency of the tone will then sweep in some band. For example, when the control tuning word 1104 of the NCO 1102 steps up and down with time (as shown in FIG. 11 with an inset 1106), the output of the NCO sweeps in some frequency band (as shown in FIG. 11 with an inset 1108). Optionally, a gain block 1110 can be used to control the scale of the output signal. A band-limited dither signal is shown in FIG. 11 as a signal 1112.

Exemplary Data Processing System

FIG. 12 depicts a block diagram illustrating an exemplary data processing system 1200, according to one embodiment of the present disclosure. Such a data processing system could be configured to function as the controller 512 described herein.

As shown in FIG. 12, the data processing system 1200 may include at least one processor 1202 coupled to memory elements 1204 through a system bus 1206. As such, the data processing system may store program code within memory elements 1204. Further, the processor 1202 may execute the program code accessed from the memory elements 1204 via a system bus 1206. In one aspect, the data processing system may be implemented as a computer that is suitable for storing and/or executing program code. It should be appreciated, however, that the data processing system 1200 may be implemented in the form of any system including a processor and a memory that is capable of performing the functions described within this specification.

The memory elements 1204 may include one or more physical memory devices such as, for example, local memory 1208 and one or more bulk storage devices 1210. The local memory may refer to random access memory or other non-persistent memory device(s) generally used during actual execution of the program code. A bulk storage device may be implemented as a hard drive or other persistent data storage device. The processing system 1200 may also include one or more cache memories (not shown) that provide temporary storage of at least some program code in order to reduce the number of times program code must be retrieved from the bulk storage device 1210 during execution.

Input/output (I/O) devices depicted as an input device 1212 and an output device 1214, optionally, can be coupled to the data processing system. Examples of input devices may include, but are not limited to, a keyboard, a pointing device such as a mouse, or the like. Examples of output devices may include, but are not limited to, a monitor or a display, speakers, or the like. Input and/or output devices may be coupled to the data processing system either directly or through intervening I/O controllers.

In an embodiment, the input and the output devices may be implemented as a combined input/output device (illustrated in FIG. 12 with a dashed line surrounding the input device 1212 and the output device 1214). An example of such a combined device is a touch sensitive display, also sometimes referred to as a "touch screen display" or simply "touch screen". In such an embodiment, input to the device may be provided by a movement of a physical object, such as e.g. a stylus or a finger of a user, on or near the touch screen display.

A network adapter 1216 may also, optionally, be coupled to the data processing system to enable it to become coupled to other systems, computer systems, remote network devices, and/or remote storage devices through intervening private or public networks. The network adapter may comprise a data receiver for receiving data that is transmitted by said systems, devices and/or networks to the data processing system 1200, and a data transmitter for transmitting data from the data processing system 1200 to said systems, devices and/or networks. Modems, cable modems, and Ethernet cards are examples of different types of network adapter that may be used with the data processing system 1200.

As pictured in FIG. 12, the memory elements 1204 may store an application 1218. In various embodiments, the application 1218 may be stored in the local memory 1208, the one or more bulk storage devices 1210, or apart from the local memory and the bulk storage devices. It should be appreciated that the data processing system 1200 may further execute an operating system (not shown in FIG. 12) that can facilitate execution of the application 1218. The application 1218, being implemented in the form of executable program code, can be executed by the data processing system 1200, e.g., by the processor 1202. Responsive to executing the application, the data processing system 1200 may be configured to perform one or more operations or method steps described herein.

Variations and Implementations

While embodiments of the present disclosure were described above with references to exemplary implementations as shown in FIGS. 1-12, a person skilled in the art will realize that the various teachings described above are applicable to a large variety of other implementations. In particular, while some descriptions provided in the present disclosure refer to thermometer coding, these descriptions are equally applicable to other coding methods used in DACs. Further, while examples provided herein are described with reference to a DAC comprising 15 DAC units, of course in other implementations any other number of DAC units could be used.

In certain contexts, the features discussed herein can be applicable to automotive systems, safety-critical industrial applications, medical systems, scientific instrumentation, wireless and wired communications, radar, industrial process control, audio and video equipment, current sensing, instrumentation (which can be highly precise), and other digital-processing-based systems.

Moreover, certain embodiments discussed above can be provisioned in digital signal processing technologies for medical imaging, patient monitoring, medical instrumentation, and home healthcare. This could include pulmonary monitors, accelerometers, heart rate monitors, pacemakers, etc. Other applications can involve automotive technologies for safety systems (e.g., stability control systems, driver assistance systems, braking systems, infotainment and interior applications of any kind).

In yet other example scenarios, the teachings of the present disclosure can be applicable in the industrial markets that include process control systems that help drive productivity, energy efficiency, and reliability. In consumer applications, the teachings of the signal processing circuits discussed above can be used for image processing, auto focus, and image stabilization (e.g., for digital still cameras, camcorders, etc.). Other consumer applications can include audio and video processors for home theater systems, DVD recorders, and high-definition televisions.

In the discussions of the embodiments above, components of a system, such as e.g. clocks, multiplexers, buffers, and/or other components can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure related to virtual dithering.

Parts of various systems for implementing virtual dithering functionality as proposed herein can include electronic circuitry to perform the functions described herein. In some cases, one or more parts of the system can be provided by a processor specially configured for carrying out the functions described herein. For instance, the processor may include one or more application specific components, or may include programmable logic gates which are configured to carry out the functions describe herein. The circuitry can operate in analog domain, digital domain, or in a mixed signal domain. In some instances, the processor may be configured to carrying out the functions described herein by executing one or more instructions stored on a non-transitory computer readable storage medium.

In one example embodiment, any number of electrical circuits of FIGS. 2, 5, 8, and 12 may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of FIGS. 2, 5, 8, and 12 may be implemented as stand-alone modules (e.g., a device with associated components and circuitry configured to perform a specific application or function) or implemented as plug-in modules into application specific hardware of electronic devices. Note that particular embodiments of the present disclosure implementing virtual dithering functionality may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the functionalities of virtual dithering method proposed herein may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of FIGS. 2 and 5-12 may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of FIGS. 2, 5, 8, and 12 and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the functions related to the virtual dithering method as proposed herein illustrate only some of the possible functions that may be executed by, or within, system illustrated in FIGS. 2, 5, 8, and 12. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims.

Although the claims are presented in single dependency format in the style used before the USPTO, it should be understood that any claim can depend on and be combined with any preceding claim of the same type unless that is clearly technically infeasible.

Note that all optional features of the apparatus described above may also be implemented with respect to the method or process described herein and specifics in the examples may be used anywhere in one or more embodiments.

What is claimed is:

1. A method for controlling a digital-to-analog converter (DAC) comprising a plurality of DAC units, the method comprising:
for each digital input value of a time-series of digital input values,
selecting a DAC unit of the plurality of DAC units as a first DAC unit of a respective ordered subset of the plurality of DAC units to convert the digital input value to an analog signal corresponding to the digital input value; and
switching on the ordered subset of the plurality of DAC units to generate the analog signal corresponding to the digital input value,
wherein the first DAC unit is selected based on a band-limited dither signal.

2. The method according to claim 1, wherein:
the plurality of DAC units are arranged in an array,
the first DAC unit is selected as the DAC unit that is a number of DAC units away from a reference DAC unit of the array, and
the number depends on a value of the band-limited dither signal at a predefined time.

3. The method according to claim 2, wherein the band-limited dither signal is such that, for each digital input value of the time-series of the digital input values, all DAC units of the ordered subset are positioned within the array after the first DAC unit.

4. The method according to claim 1, wherein a frequency band of the band-limited dither signal is different from a frequency band of the time-series of the digital input values.

5. An apparatus for controlling a digital-to-analog converter (DAC) comprising a plurality of DAC units, the apparatus comprising:
at least one memory configured to store computer executable instructions, and
at least one processor coupled to the at least one memory and configured, when executing the instructions, to:
for each digital input value of a time-series of digital input values,
select a DAC unit of the plurality of DAC units as a first DAC unit of a respective ordered subset of the plurality of DAC units to convert the digital input value to an analog signal corresponding to the digital input value; and
switch on the ordered subset of the plurality of DAC units to generate the analog signal corresponding to the digital input value,
wherein the first DAC unit is selected based on a band-limited dither signal.

6. The apparatus according to claim 5, wherein:
the plurality of DAC units are arranged in an array,
the first DAC unit is selected as the DAC unit that is a number of DAC units away from a reference DAC unit of the array, and
the number depends on a value of the band-limited dither signal at a predefined time.

7. The apparatus according to claim 6, wherein the predefined time depends on a position of the digital input value within the time-series of digital input values.

8. The apparatus according to claim 5, wherein the band-limited dither signal is such that, for each digital input value of the time-series of the digital input values, all DAC units of the ordered subset are positioned within the array after the first DAC unit.

9. The apparatus according to claim 5, wherein the plurality of DAC units are arranged in an array and the ordered subset comprises consecutive DAC units of the array.

10. The apparatus according to claim 5, wherein a number of DAC units within the ordered subset depends on the digital input value.

11. The apparatus according to claim 5, wherein the band-limited dither signal comprises a NCO-generated signal.

12. The apparatus according to claim 5, wherein a frequency band of the band-limited dither signal is different from a frequency band of the time-series of the digital input values.

13. The apparatus according to claim 5, further comprising the DAC.

14. The apparatus according to claim 5, further comprising a generator configured to generate the band-limited dither signal.

15. The apparatus according to claim 14, wherein the generator comprises a numerically controller oscillator (NCO) configured to operate in sweep frequency mode.

16. A non-transitory computer readable storage medium storing software code portions configured for, when executed on a processor, carrying out a method for controlling a digital-to-analog converter (DAC) comprising a plurality of DAC units, the method comprising:
for each digital input value of a time-series of digital input values,
selecting a DAC unit of the plurality of DAC units as a first DAC unit of a respective ordered subset of the plurality of DAC units to convert the digital input value to an analog signal corresponding to the digital input value; and
switching on the ordered subset of the plurality of DAC units to generate the analog signal corresponding to the digital input value,
wherein the first DAC unit is selected based on a band-limited dither signal.

17. The non-transitory computer readable storage medium according to claim 16, wherein:
the plurality of DAC units are arranged in an array,
the first DAC unit is selected as the DAC unit that is a number of DAC units away from a reference DAC unit of the array, and
the number depends on a value of the band-limited dither signal at a predefined time.

18. The non-transitory computer readable storage medium according to claim 17, wherein the band-limited dither signal is such that, for each digital input value of the time-series of the digital input values, all DAC units of the ordered subset are positioned within the array after the first DAC unit.

19. The non-transitory computer readable storage medium according to claim 16, wherein a frequency band of the band-limited dither signal is different from a frequency band of the time-series of the digital input values.

20. The non-transitory computer readable storage medium according to claim 16, wherein the band-limited dither signal comprises a NCO-generated signal.

* * * * *